United States Patent
Dando, III et al.

(10) Patent No.: US 7,995,344 B2
(45) Date of Patent: Aug. 9, 2011

(54) HIGH PERFORMANCE LARGE TOLERANCE HEAT SINK

(75) Inventors: Charles H. Dando, III, Vestal, NY (US); Jon Larcheveque, Owego, NY (US); David L. Vos, Apalachin, NY (US)

(73) Assignee: Lockheed Martin Corporation, Bethseda, MD (US)

( * ) Notice: Subject to any disclaimer, the term of this patent is extended or adjusted under 35 U.S.C. 154(b) by 0 days.

(21) Appl. No.: 11/621,170

(22) Filed: Jan. 9, 2007

(65) Prior Publication Data

US 2007/0159799 A1     Jul. 12, 2007

Related U.S. Application Data

(60) Provisional application No. 60/757,750, filed on Jan. 9, 2006.

(51) Int. Cl.
*H05K 7/20*        (2006.01)

(52) U.S. Cl. ........ 361/710; 361/704; 361/705; 361/711; 361/719; 165/80.3; 165/104.33; 165/185; 257/706; 257/713; 257/718

(58) Field of Classification Search .......... 361/702–712, 361/714–719, 687; 165/80.3, 46, 104.33, 165/185; 257/685, 706–727, 796; 252/511; 428/112, 117, 320.2, 305.5, 332, 457; 174/16.3, 174/252

See application file for complete search history.

(56) References Cited

U.S. PATENT DOCUMENTS

| | | | | |
|---|---|---|---|---|
| 3,482,198 A * | 12/1969 | Hopper, Jr. | | 338/19 |
| 4,093,971 A * | 6/1978 | Chu et al. | | 361/702 |
| 4,151,547 A * | 4/1979 | Rhoades et al. | | 257/718 |
| 4,415,025 A * | 11/1983 | Horvath | | 165/185 |
| 4,442,450 A * | 4/1984 | Lipschutz et al. | | 257/713 |
| 4,479,140 A * | 10/1984 | Horvath | | 257/713 |
| 4,685,606 A | 8/1987 | Flint et al. | | |
| 5,006,924 A * | 4/1991 | Frankeny et al. | | 257/714 |
| 5,031,689 A * | 7/1991 | Jones et al. | | 165/185 |
| 5,245,508 A | 9/1993 | Mizzi | | |
| 5,270,902 A * | 12/1993 | Bellar et al. | | 361/718 |
| 5,287,001 A * | 2/1994 | Buchmann et al. | | 257/719 |
| 5,296,310 A * | 3/1994 | Kibler et al. | | 428/614 |
| 5,306,866 A | 4/1994 | Gruber et al. | | |

(Continued)

FOREIGN PATENT DOCUMENTS

EP      0 002 883 A1 *    7/1979

(Continued)

OTHER PUBLICATIONS

Shu Zhang; Thermal Management in RF Packages; EMPFASIS; http://www.empf.org/empfasis/mar04/thermal.htm, Jan. 9, 2006.

*Primary Examiner* — Michael V Datskovskiy

(74) *Attorney, Agent, or Firm* — Burns & Levinson, LLP; Jacob N. Erlich, Esq.; Harvey Kaye, Esq.

(57) ABSTRACT

A heat sink apparatus for electronic components provides a heat sink and a deformable, convex foil construction affixed to the heat sink around a periphery of the foil construction and adapted to extend away from the heat sink to enable deformation of the convex foil construction as a result of contact with a top surface of an electronic component mounted opposite the foil construction.

14 Claims, 6 Drawing Sheets

U.S. PATENT DOCUMENTS

| | | | |
|---|---|---|---|
| 5,323,292 A | | 6/1994 | Brzezinski |
| 5,438,477 A | * | 8/1995 | Pasch ............................ 361/689 |
| 5,528,456 A | * | 6/1996 | Takahashi ..................... 361/704 |
| 5,548,090 A | * | 8/1996 | Harris ........................... 174/252 |
| 5,560,423 A | | 10/1996 | Larson et al. |
| 5,653,285 A | | 8/1997 | Lee |
| 5,786,635 A | * | 7/1998 | Alcoe et al. ................... 257/718 |
| 5,863,467 A | * | 1/1999 | Mariner et al. ............... 252/511 |
| 6,091,199 A | * | 7/2000 | Van Pelt et al. ................ 315/50 |
| 6,097,598 A | | 8/2000 | Miyahara et al. |
| 6,131,646 A | | 10/2000 | Kelley |
| 6,131,651 A | * | 10/2000 | Richey, III .................... 165/185 |
| 6,367,541 B2 | | 4/2002 | McCullough |
| 6,407,922 B1 | * | 6/2002 | Eckblad et al. ............... 361/704 |
| 6,411,513 B1 | * | 6/2002 | Bedard .......................... 361/704 |
| 6,496,373 B1 | * | 12/2002 | Chung .......................... 361/705 |
| 7,019,976 B1 | * | 3/2006 | Ahmad et al. ................ 361/704 |
| 7,063,127 B2 | * | 6/2006 | Gelorme et al. ............. 165/80.2 |
| 7,187,553 B2 | * | 3/2007 | Schmidberger ............... 361/719 |
| 7,200,006 B2 | * | 4/2007 | Farrow et al. ................ 361/704 |
| 7,242,585 B2 | * | 7/2007 | Fukuma et al. ............... 361/719 |
| 7,264,041 B2 | * | 9/2007 | Karidis et al. ........... 165/104.33 |
| 7,269,015 B2 | * | 9/2007 | Hornung et al. .............. 361/704 |
| 7,355,855 B2 | * | 4/2008 | Karidis et al. ................. 361/710 |
| 7,361,985 B2 | * | 4/2008 | Yuan et al. .................... 257/713 |
| 7,362,582 B2 | * | 4/2008 | Karidis et al. ................. 361/710 |
| 7,518,066 B2 | * | 4/2009 | Thompson et al. ........... 174/262 |
| 7,593,228 B2 | * | 9/2009 | Jarrett et al. .................. 361/704 |
| 7,646,608 B2 | * | 1/2010 | Thompson et al. ........... 361/711 |
| 7,646,660 B2 | * | 1/2010 | Tomita .......................... 365/222 |
| 2002/0015288 A1 | * | 2/2002 | Dibene et al. ................. 361/711 |
| 2002/0088605 A1 | * | 7/2002 | Malhammar .................... 165/46 |
| 2002/0195228 A1 | * | 12/2002 | Corti et al. .................... 165/80.3 |
| 2003/0127727 A1 | * | 7/2003 | Suehiro et al. ................ 257/712 |
| 2004/0099944 A1 | * | 5/2004 | Kimura ......................... 257/706 |
| 2005/0017350 A1 | * | 1/2005 | Corti et al. .................... 257/706 |
| 2005/0199367 A1 | * | 9/2005 | Romahn ....................... 165/80.3 |
| 2007/0091574 A1 | * | 4/2007 | Jarrett et al. .................. 361/704 |

FOREIGN PATENT DOCUMENTS

| | | | |
|---|---|---|---|
| EP | 0002883 A1 | * | 7/1979 |
| EP | 000651603 A2 | * | 5/1995 |
| JP | 404280460 A | * | 10/1992 |
| JP | 2004172313 A | * | 6/2004 |
| JP | 2006024720 A | * | 1/2006 |

* cited by examiner

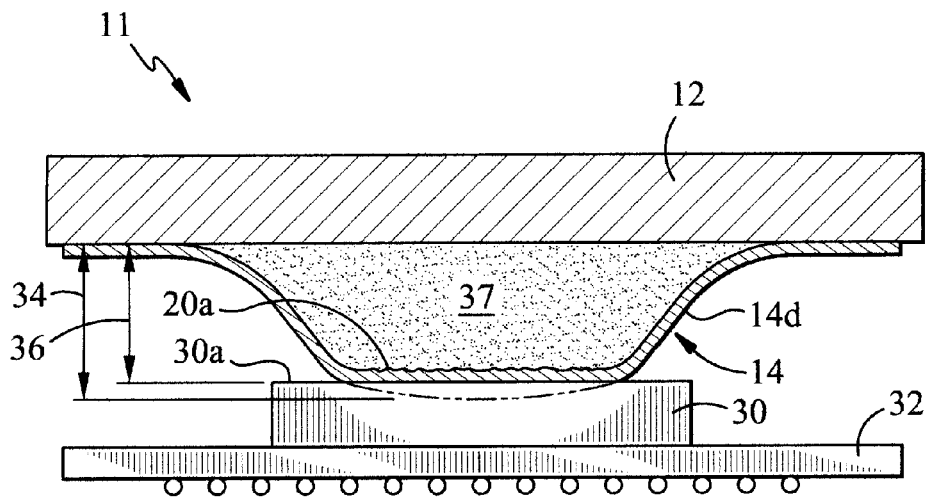
FIG. 3
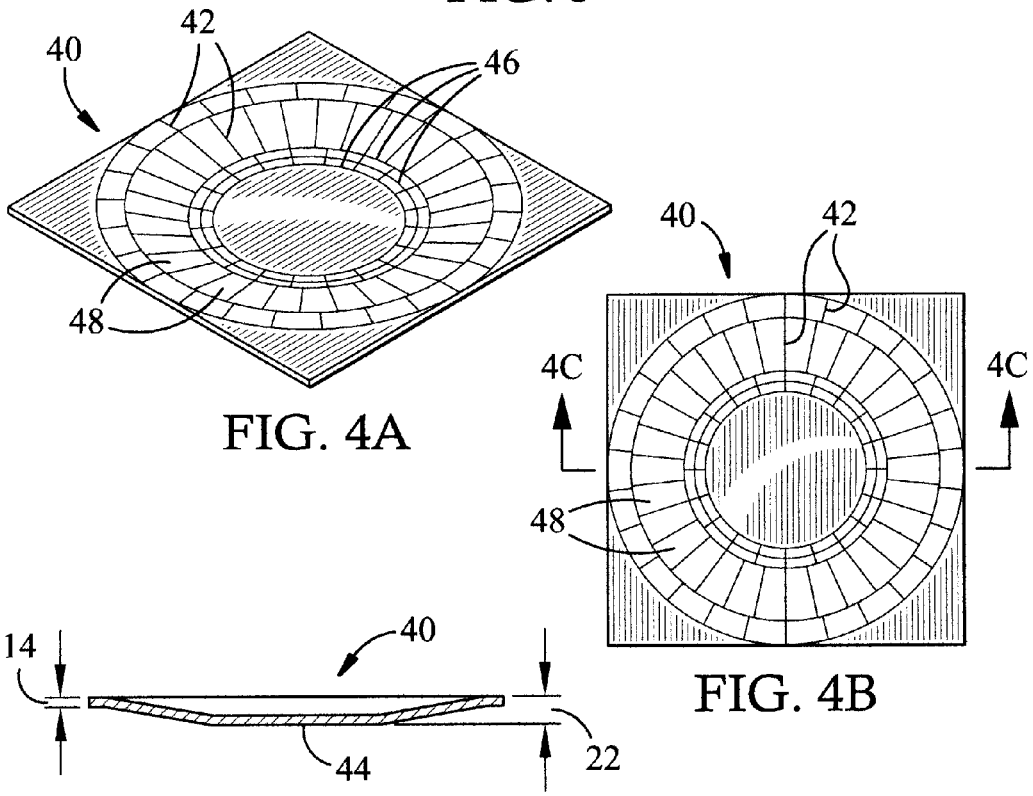
FIG. 4A
FIG. 4B
FIG. 4C

HIGH PERFORMANCE LARGE TOLERANCE HEAT SINK

RELATED APPLICATIONS

The present application claims priority from U.S. provisional patent application Ser. No. 60/757,750, filed Jan. 9, 2006.

FIELD OF THE INVENTION

This invention relates generally to heat sinks for electronic components, and more particularly, to heat sink/component interfaces that use heat conducting foil.

BACKGROUND OF THE INVENTION

Conduction is a heat transfer mechanism used in electronics design. Even if a system is designed for convection cooling of the circuit boards, conduction is still the dominant heat transfer mechanism for component devices located on circuit boards. This is especially true of power electronics, where concentrations of heat are developed in components. This heat must be transferred via conduction to the component case, the circuit board, or a heat sink before it can be handled by system level cooling mechanisms. Consequently, electronics designers are constantly evaluating new techniques of thermal conduction to dissipate heat from electronic components.

The most critical path for cooling electronics is the interface between the electronic component and the heat sink. Driving constraints are interface thermal resistance, bulk thermal conductivity, machining tolerance range, contamination at the interface joints, electrical isolation, handling cost, and material cost. The prior art addresses these problems using grease, cure in-place thermal bonds, preformed thermal pads, copper tape, copper covered foam pads, metallic or component heat sinks, individual component heat sinks, and single piece skylined heat sinks for all or part of a printed wiring board (PWB). The term "skylined" refers to the cross sectional profile formed by a plurality of electronic components on a PWB, as the varying heights or thicknesses of the electronic components give the appearance of a city skyline.

SUMMARY OF THE INVENTION

One embodiment of the present invention provides a heat sink apparatus for electronic components, comprising a heat sink and a deformable, convex foil construction affixed to the heat sink around a periphery of the foil construction and adapted to extend away from the heat sink to enable deformation of the convex foil construction as a result of contact with a top surface of an electronic component mounted opposite the foil construction to conduct heat there from.

The convex foil construction may be sufficiently deformable to tolerate differences in spacing between the heat sink and different electronic components and still provide contact with a top surface of the different electronic components when mounted opposite the heat sink.

The convex foil construction may be adapted to maintain contact with a top surface of an electronic component mounted opposite the foil construction during variation in spacing between the heat sink and the electronic component. The convex foil construction may be sufficiently flexible to allow relative movement between the heat sink and the electronic component while maintaining a heat conduction path there between.

The foil construction may include two layers of foil sandwiching a layer of pyrolytic graphite there between. The foil construction may include one or more limited thermal vias between the two layers of foil.

The foil construction may include a foil layer having a generally sinusoidal or dome shape along a centered cross section of the foil construction. The sinusoidal or dome shaped cross section of the foil may be adapted to produce a mechanical bias of a top portion of the foil construction away from the heat sink.

The apparatus may further comprise a bonding agent located on a contact surface of the foil construction and adapted to maintain physical and thermal contact between the foil construction and an opposed electronic component. The bonding agent may be located to thermally bond the foil construction to the heat sink The foil construction may be adapted to flex in response to relative movement between the heat sink and the opposed electronic component.

The dome-shaped foil construction may create an enclosed volume when affixed to the heat sink. The apparatus may further comprise a resilient filling located within the enclosed volume of the dome-shaped foil construction.

The heat sink may have a substantially flat surface area, and further comprise a multiplicity of the foil constructions affixed to the surface area of the heat sink and adapted for proximal location facing an electronic component side of a printed wiring board. The individual foil constructions of the multiplicity of the foil constructions may be substantially identical and are affixed to the heat sink surface area in a patterned array. The individual foil constructions in the patterned array may be spaced closely together to minimize interstices there between. The apparatus may further comprise an electrical insulating layer positioned between the multiplicity of foil constructions and opposed electronic components on a printed wiring board. The individual foil constructions of the multiplicity of foil constructions may be individually arranged and sized for making contact with electronic components on a specific printed wiring board when the heat sink surface area is located substantially parallel to an electronic component surface of the specific printed wiring board.

In another embodiment, the present invention provides a heat sink apparatus for electronic components, comprising a heat sink and a deformable, convex foil construction affixed to the heat sink and shaped to mechanically bias a distal portion of the convex foil construction away from the heat sink to provide contact between the distal portion and a top surface of an electronic component mounted opposite the heat sink to conduct heat there from.

The foil construction may include a foil layer having a generally sinusoidal or dome shape along a vertical cross section of the foil construction. The convex foil construction may be adapted to maintain contact between the distal portion of the foil construction and a top surface of an electronic component mounted opposite the heat sink during variation in spacing between the heat sink and the electronic component.

BRIEF DESCRIPTION OF THE DRAWINGS

The present invention may best be understood from the following detailed description of the embodiments illustrated in the drawings, wherein:

FIG. 3 is a sectional view of the heat sink apparatus of FIG. 2B located in thermal contact with an electronic component;

FIGS. 4A, 4B, 4C are perspective, top and side sectional views, respectively, of a portion of a heat sink apparatus constructed in accordance with another embodiment of the present invention;

DETAILED DESCRIPTION OF PREFERRED EMBODIMENTS

Conduction is defined as the transfer of heat through a static (non-moving) material. Heat will flow through the material if there is a temperature differential across it. The heat flow will be in the direction from the higher temperature to the lower temperature. The rate of heat flow will depend upon the temperature differential and the thermal conductivity (reciprocal of thermal resistance) of the material. The overall relationships are analogous to current flow in an electric circuit, where temperature differential is equivalent to voltage differential, thermal conductivity is equivalent to electrical conductivity, the rate of heat flow is equivalent to electric current, and thermal resistance is equivalent to electrical resistance.

Figure 1:
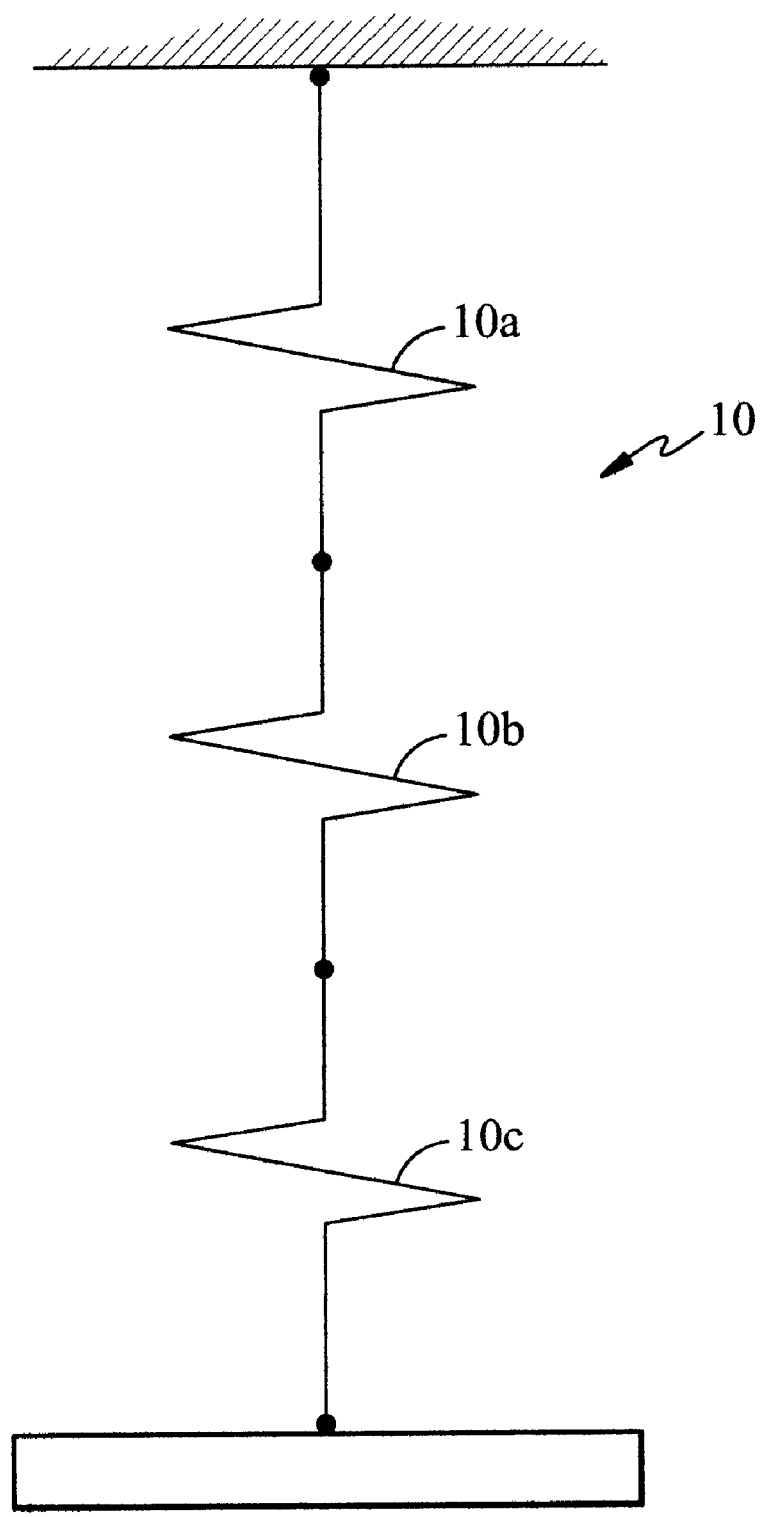
FIG. 1 is a thermal schematic of one or more embodiments described herein.

An illustration of a thermal circuit 10 of a heat sink constructed in accordance with one embodiment of the present invention is shown in FIG. 1 and represented in equation form below:

$$R_{th\ total} = R_{th\ bond\ 1}(10a) + R_{th\ thermal\ conductive\ material}(10b) + R_{th\ bond\ 2}(10c)$$

where:

$R_{th\ total}$ is the sum of the thermal resistance of the heat path from the electronic component to the heat sink;

$R_{th\ bond\ 1}$ is the thermal resistance of a bond joining the heat sink and a thermally conductive material;

$R_{th\ thermal\ conductive\ material}$ is the thermal resistance of the thermal conductive material (such as a thermal foil); and $R_{th\ bond\ 2}$ is the thermal resistance of a bond joining the electronic component and the thermal conductive material.

The thermal interfaces are arranged in series with the thermal conductive material comparable to "series resistors" in an electrical circuit. Although the term "bond" is used, the respective resistance may alternatively represent the thermal resistance of simple physical contact, such as between the thermally conductive material and the electronic component.

Figure 2A:
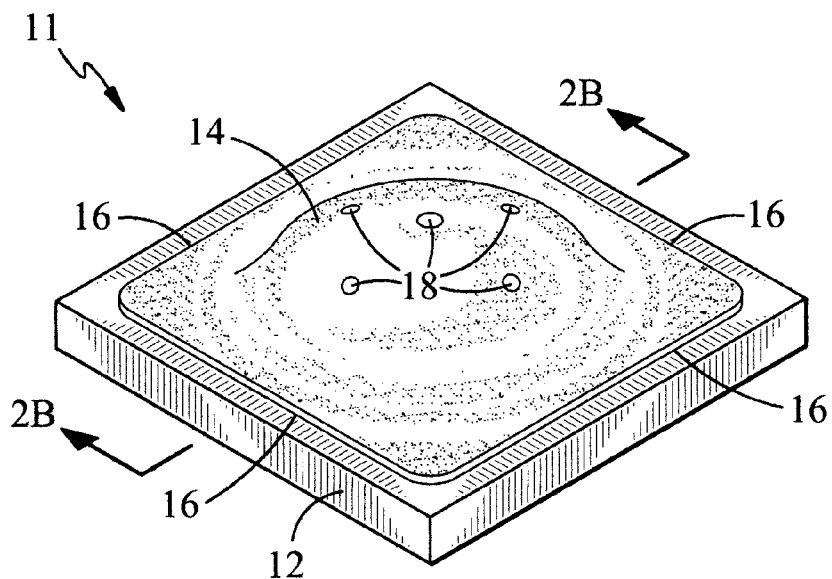
FIG. 2A is a perspective view of a heat sink apparatus constructed in accordance with one embodiment of the present invention.

FIG. 2A is a perspective view of a heat sink apparatus 11, which generally includes a heat sink substrate 12 and a dome-shaped or convex foil shell or construction 14 extending away from heat sink substrate 12. Foil construction 14 is affixed to heat sink substrate 12 around a periphery 16 of foil construction 14. Foil construction 14 also includes one or more thermal vias 18, which are described in reference to FIG. 2B.

Figure 2B:
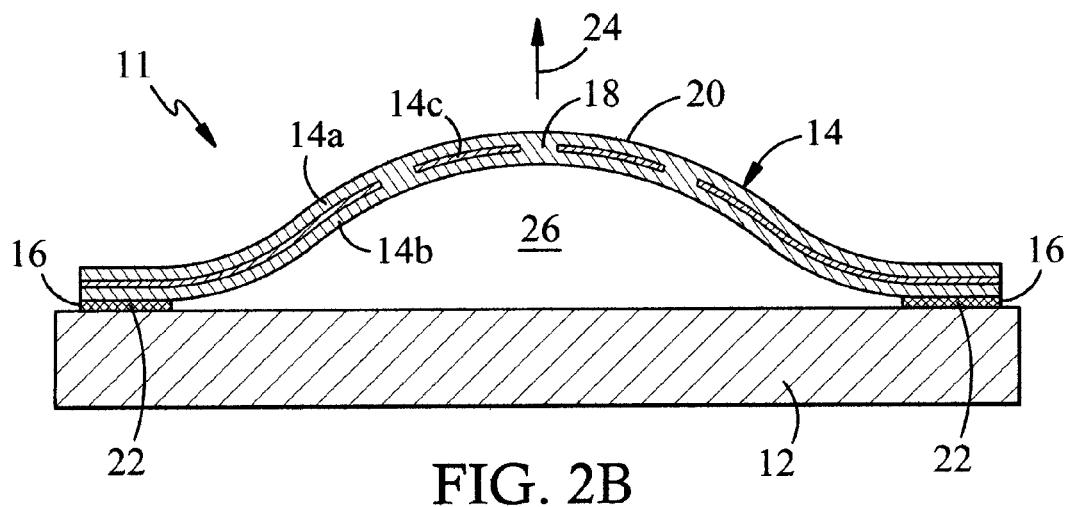
FIG. 2B is a cross-sectional view of the embodiment of FIG. 2A taken along view lines 2B-2B in FIG. 2A.

FIG. 2B shows a cross-sectional view of the heat sink apparatus 11 taken along view lines 2B-2B of FIG. 2A. Foil construction 14 is shown in FIG. 2B with a thickness which is disproportionately larger for the purpose of showing multi-layer details thereof. Foil construction 14 is shown to be formed by an outer foil layer 14a, an inner foil layer 14b and a sandwiched layer 14c. This arrangement allows foil construction 14 to take advantage of flexible aluminum outer layers, while improving the thermal conductivity of aluminum through appropriate choice of the sandwiched middle layer 14c. In a preferred embodiment, center layer 14c is constructed with pyrolytic graphite.

The thermal conductivity and the physical resilience of foil construction 14 may be further enhanced by the use of thermal vias 18, which are essentially compressed areas of the thickness of foil construction 14. Thermal vias 18 improve thermal conductivity between all layers of foil construction 14 to thereby improve the thermal conductivity of the overall foil construction 14. Thermal vias 18 further create a combined structure out of the separate foil layers 14a, 14b. This combined structure provides greater support and resilience to a top portion 20 of foil construction 14.

FIG. 2B also shows the presence of bond material 22, which is used to affix foil construction 14 to heat sink substrate 12 around periphery 16. Bond material 22 preferably has a low level of thermal resistance and thereby a high level of thermal conductivity. Any suitable bond material may be used, with one example being SC-320 available from Lord Corporation.

FIG. 2B further shows that the layers 14a, 14b, 14c of foil construction 14 form a convex shell having a generally sinusoidal shape along the cross section of FIG. 2A. This arrangement provides foil construction 14 with a mechanical bias of the top portion 20 of foil construction 14 in the direction of arrow 24 away from heat sink substrate 12. This mechanical bias may be maintained by foil construction 14 in spite of relative movement between heat sink substrate 12 and an electronic component (not shown) located in contact with the top portion 20 of foil construction 14. As mentioned, this mechanical bias is further maintained by the multiple foil layers 14a, 14b interconnected by vias 18. Lastly, FIG. 2B shows a chamber or volume 26 formed between heat sink substrate 12 and foil construction 14 by the dome-shape (or sinusoidal cross section) of foil construction 14.

FIG. 3 shows an inverted cross section of heat sink apparatus 11 located in operative association with an electronic component 30, such as an integrated circuit, which is mounted on a printed wiring board 32. Foil construction 14 is shown without the details of multiple layers 14a, 14b, 14c of FIG. 2B. Foil construction 14 is shown to be deformed or crushed over its top surface area 20a from its original height 34, which deformation is caused by the interference with electronic component 30. Of course, the reference to a top of foil construction 14 in FIG. 3 is used for consistency with FIG. 2B to identify the portion 20a which extends furthest from heat sink 12.

The new height 36 of foil construction 14 from heat sink substrate 12 is determined by the clearance or tolerance between heat sink substrate 12 and electronic component 30 in the final construction represented by FIG. 3. This deformation causes top portion 20a to assume a generally flat shape conforming to the top 30a of electronic component 30. In this arrangement, the angular position of the still sinusoidally shaped sides 14d of foil construction 14 help to maintain contact between top portion 20a of foil construction 14 and top 30a of electronic component 30 during relative movement between heat sink substrate 12 and electronic component 30 or printed wiring board 32. Such relative movement might be due to any cause, such as thermal expansion or contraction or vibration. FIG. 3 also shows heat sink apparatus 11 to be filled with a resilient filling 37, which may be used to further enhance the mechanical bias of top portion 20a against the top 30a of electronic component 30.

Foil construction 14 preferably includes a high performance thermal conductive material (such as a thermal foil) made from highly conductive, flexible material with deformable or pliable properties. A thermal foil will be used herein as an example of the thermal conductive material throughout this application, but any thermally conductive material is acceptable as long as the $R_{th\ total}$ objectives are achieved. The thermal foil can be one sheet or a plurality of sheets of conductive materials with varying conductive properties. One exemplary embodiment of a multi-layer thermal foil has a core layer made from Annealed Pyrolytic Graphite (APG) or Thermal Pyrolytic Graphite (TPG) material, as mentioned above, with two outer layers 14a, 14b made of copper or aluminum to substantially enclose the APG material. An important characteristic of foil construction 14 is the XY thermal conductivity, which can reach 1700 W/m° K for the APG foil construction 14 described above. This thermal conductivity is obviously much higher than that of a simple foil of aluminum at 200 W/m° K or copper at 400 W/m° K.

The stiffness or resilience of foil construction 14 is also controlled by the dimensions of foil layers 14a, 14b. If foil thickness is too thin, there may not be enough thermal conductivity. If foil thickness is too thick, foil construction 14 may not deform as desired and may not fit in the gap between electronic component 30 and heat sink substrate 12. In one embodiment, foil layers 14a, 14b have a sheet thickness ranging from approximately 20 mil to 55 mil. To be deformed as desired and provide better heat conduction properties, the APG material has low stiffness so that the stiffness is comparable to two 5 mil sheets or skins of copper or aluminum, which allows foil construction 14 to deflect easier that a comparable thickness of aluminum.

For illustration purposes the thermal foil 10 is in the form of a dome 12 having sheet thicknesses 14 ranging from approximately 20 mil to 55 mil (FIGS. 3A-3C). To be deformed as desired and provide better heat conduction properties, the APG has low stiffness so that the stiffness is comparable to two 5 mils sheets or skins of copper or aluminum, which allows the dome 12 to deflect easier that a comparable thickness of aluminum. The foil thickness 14 of 20 to 55 mils is important in that its thin nature keeps the stiffness low so the dome 12 can deflect. If the thickness 14 is too thin, then there is not enough thermal conductivity. If the thickness 14 is made too thick, then the thermal foil 10 will not fit in the gap 16 (FIG. 4B) between the electronic component 18 and the heat sink 20. There are many combinations of dome 12 patterns including, but not limited to:

A. a single dome for single component;
B. an array of domes for multiple components (e.g., highly conductive "bubble wrap");
C. a unique dome for one high power component (e.g., copper/APG/copper foil) surrounded by array of domes component (e.g., aluminum/APG/aluminum); and
D. an array that provides contact across uneven profiles (e.g., interfaces to tall and short components) in all three axes (influenced by geometry of dome height 22 and dome spacing (not shown)).

As discussed above, the thermal foil 10 has a three dimensional shape with permitted deformation, is a highly conductive solid composite material plus bonding process and can be provided as a single component contact or repeating array pattern to contact multiple devices. This configuration provides contact across uneven profiles (e.g., interfaces to tall and short components) in all three axes (influenced by geometry of "dome height" and "dome spacing"). While a single piece metal heat sink must be custom skylined for each specific configuration of an entire circuit card with restrictive tolerances, a generic foil with a repeating pattern array of shapes can be applied to a flat heat sink (less weight and lower machining costs).

FIGS. 4A, 4B and 4C are perspective, top and sectional views, respectively, of a foil construction 40, which is shown with patterned lines 42 to better represent the dome-like shape of foil construction 40. The perspective view of FIG. 4A shows the inside of foil construction 40, which thus appears to have a concave shape, whereas the component contact portion 44 (FIG. 4C) has a convex shape. The circles 46 represent initial crush zones of foil construction 40, while radial sections 48 represent secondary crush zones.

Figure 5:
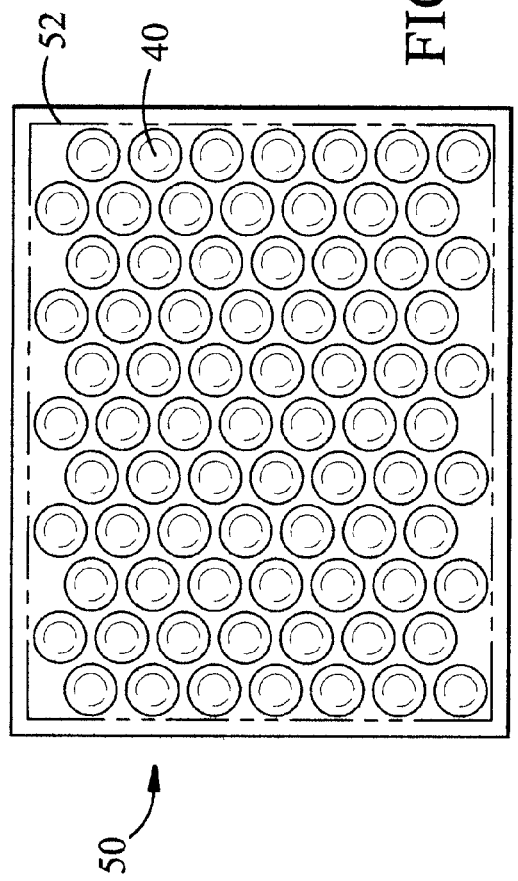
FIG. 5 is a plan view of a heat sink apparatus constructed with multiple copies of the embodiment of FIGS. 2A, 2B, 3, 4A, 4B, 4C.

FIG. 5 shows a heat sink apparatus 50 having an array 52 of foil constructions 40. In this generic arrangement heat sink apparatus 50, may be used with a variety of PWBs having different component layouts. The separate foil constructions 40 will crush in accordance with the specific electronic components that are located opposite respective foil constructions. Alternatively to the uniform array of FIG. 5, a similar heat sink apparatus may be constructed in a customized arrangement for use with a unique PWB, having foil constructions with unique locations sizes and even heights.

Figure 6:
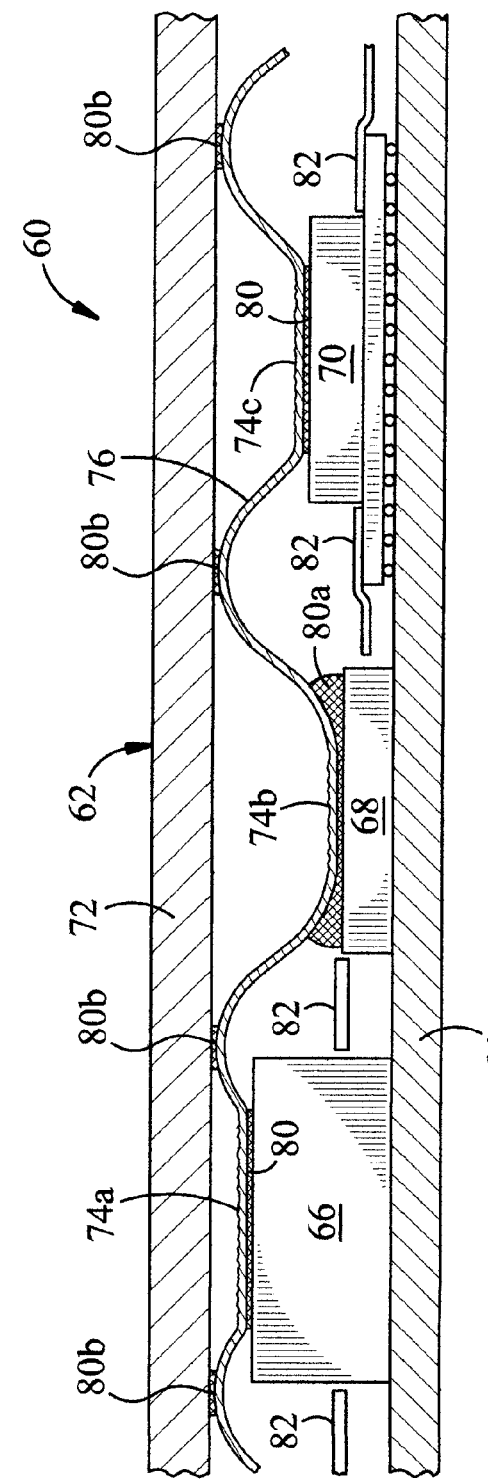
FIG. 6 is a side sectional view of another embodiment of the present invention shown in combination with a printed wiring board bearing a multiplicity of integrated circuits.

FIG. 6 shows a cross section of a nominal electronic apparatus 60 generally including a heat sink apparatus 62 and an opposed printed wiring board 64 on which are mounted components 66, 68, 70 having different sizes. Different attachment methods appear for components 66, 68, 70 to PWB 64 because those different attachment methods can have a direct effect on the height that various components extend from PWB 64.

Heat sink apparatus 62 generally includes a heat sink substrate 72 and an array of convex or dome-shaped foil constructions 74a, 74b, 74c. Foil constructions 74 are shown to be constructed from a single piece of foil 76 having a generally sinusoidal shape and being bonded to heat sink substrate 72 at points 80b, which also show the presence of a bonding agent, to form the convex or done-shaped foil constructions 74a, 74b, 74c there between. Foil 76 is depicted as having a single layer simply for purposes of clarity and preferably has the multilayer construction described in reference to FIG. 2B.

As shown in FIG. 6, components 66, 68, 70 have significant differences in height from PWB 64, which results in significant variation in the relative distance between heat sink substrate 72 and the tops of components 66, 68, 70. However, foil constructions 74a, 74b, 74c are able to compensate for these different distances by the deformable nature of their construction. Thus, foil construction 74a is almost completely crushed by component 66, foil construction 74b is barely deformed by component 68, and foil construction 74c is moderately crushed or deformed by component 70. In this manner, the thermal foil 76 of heat sink apparatus 62 can achieve substantial heat conducting contact with each of the components 66, 68, 70.

Also shown in FIG. 6 is the use of a bonding agent 80 located between the tops of components 66, 68, 70 and the distal peaks of foil constructions 74a, 74b, 74c. The ability of heat sink apparatus 62 to compensate for different height components 66, 68, 70 enables the use of only a thin layer of bonding agent 80. This enhances heat conduction through bonding agent 80 thus reducing the value of $R_{th\ bond2}$ described in reference to FIG. 1.

FIG. 6 also shows how bonding agent 80a can be used to increase the contact area between an electronic component 68 and a foil construction 74b. While the deformation of foil construction 74b is only slight, extra bonding agent 80a can be applied to foil in some of the space between the top of component 68 and foil construction 74b. Alternatively, the bonding agent may simply be used to build up the height of a low component and thereby create greater crushing or deformation of a foil construction.

The interfaces between the thermal foil 76 and the contact surfaces of the electronic components 66, 68, 70, as well as heat sink 72 are enhanced by thermal bond material 80, 80a, 80b. The thermal bond 80a can also protect the surface integrity of the electronic components 66, 68, 70 by creating a thin film barrier between the electronic components 66, 68, 70 and the thermal foil 76. Direct contact by thermal foil 76 with the top surface of the electronic components 66, 68, 70 may cause wear or damage to those top surfaces that may degrade the quality of the components. Wear may be caused by relative motion between the parts during operation. Damage may be caused during assembly of the components.

Lastly, also shown in FIG. 6 are portions of a layer of electrical insulating material 82, which may be applied between PWB 62 and heat sink apparatus 72, with appropriate cut-outs for components 66, 68, 70 Insulating material 82 allows greater crushing of foil constructions 74a, 74b, 74c with less risk of creating an electrical connection or short with foil 76. Any suitable material may be used, such as KAPTON.

During operation, the PWB 64 will undergo vibration that may result in small and/or large amplitude oscillations or deflections. Due to differences in the natural frequencies, thermal expansion coefficient, and other physical properties of the heat sink 62, thermal foil 76, electronic components 66, 68, 70, and PWB 64, there may be relative movement between each part. With one portion of the thermal foil 76 connected to the heat sink 62 and another portion of the thermal foil 76 in contact with the electronic components 66, 68, 70, the thermal foil 76 acts like a spring to maintain a positive normal or perpendicular or compressive force ("spring effect") upon the top surfaces of the electronic components 66, 68, 70 and at the thermal foil 76/heat sink 62 interface. The relative movement between the thermal foil 76 and the electronic components 66, 68, 70 can be compensated by the spring effect of the curved configuration of thermal foil 76. Other spring configurations not discussed herein are within the contemplation of the present invention. As long as the spring is not plastically deformed (other than in the predetermined crushed area), the spring will flex or bend inward or outward while under load and then substantially spring back to its original as-assembled configuration when the load is removed or relative motion stops. The spring effect provides the mechanism to maintain a substantially constant conduction heat flow during operation because the thermal foil 76 remains in the same position relative to the electronic components 66, 68, 70 and heat sink 62 throughout the operation cycle.

Contamination of the electronic components is reduced by virtue of minimizing the volume of thermal bond used. A reduction in the volume of thermal bond used is provided in that instead of filling, for example, a 55 mil gap, only 5 mils is required because the dome "fills the gap" with only 10% of the bond material.

Figure 7:
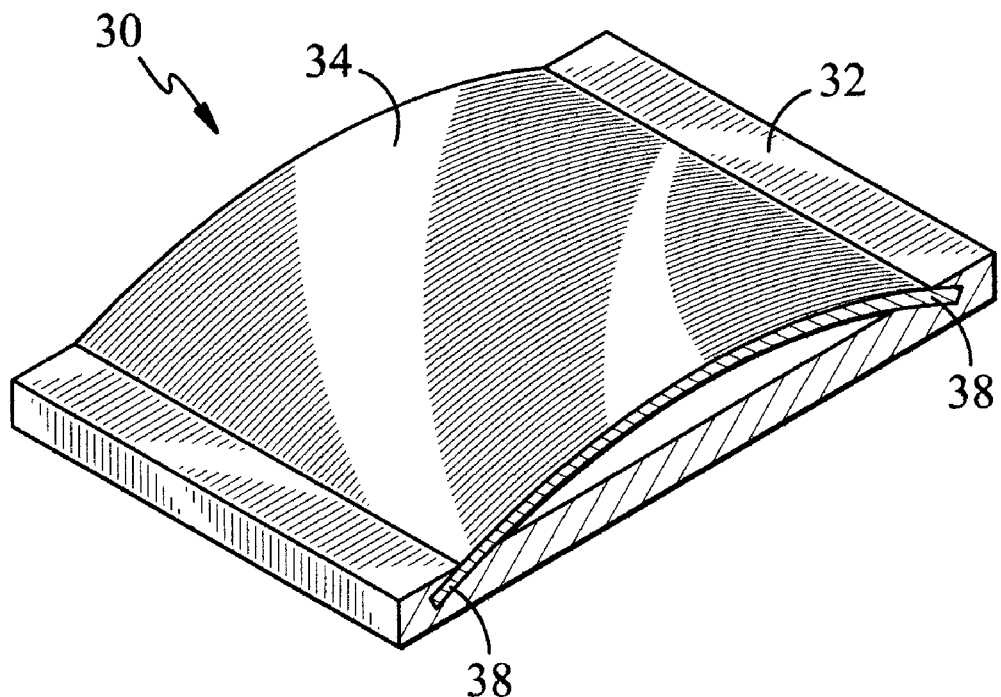
FIG. 7 is an isometric view of another embodiment of a heat sink apparatus constructed in accordance with the present invention.
Figure 8:
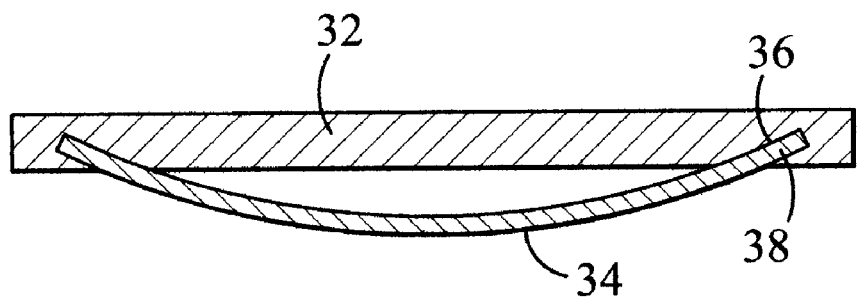
FIG. 8 is a sectional view of the embodiment shown in FIG. 7.
Figure 9:
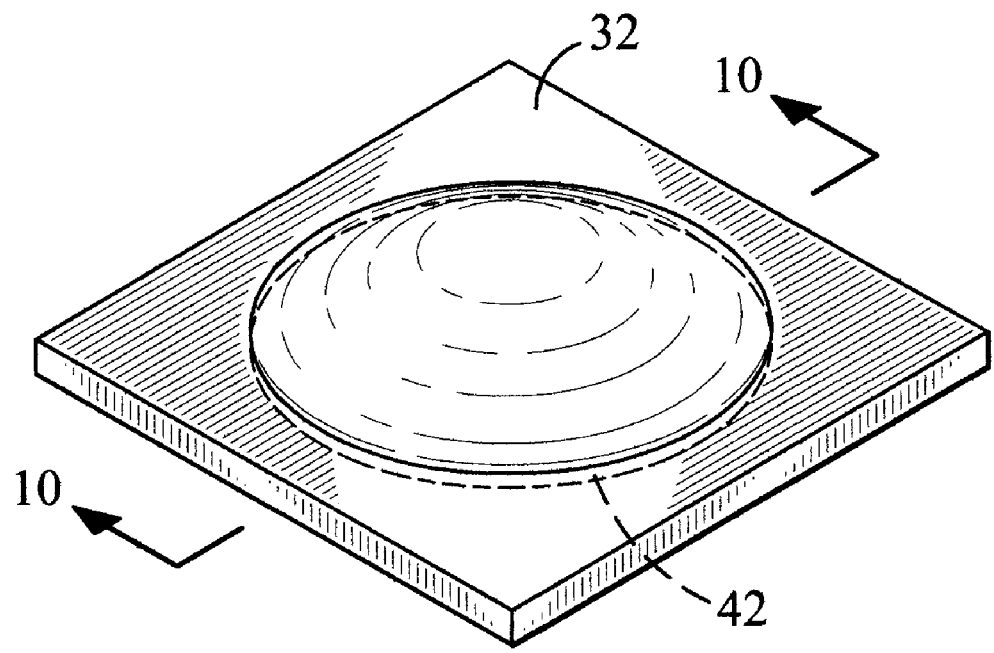
FIG. 9 is an isometric view of another embodiment of a heat sink apparatus constructed in accordance with the present invention.
Figure 10:
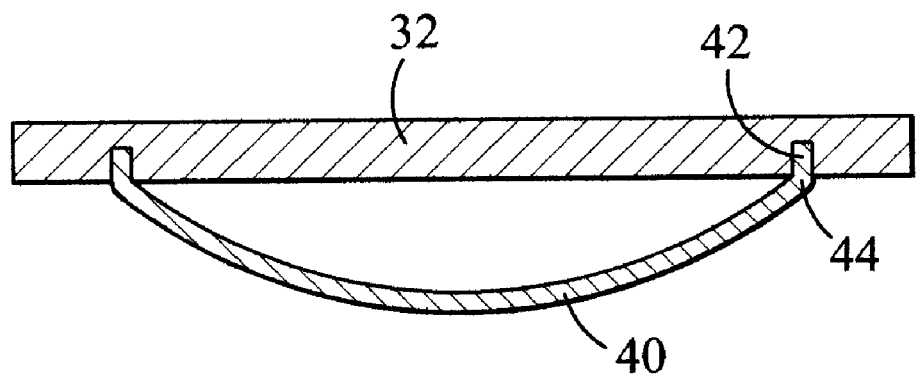
FIG. 10 is a sectional view of the embodiment shown in FIG. 9.

As discussed above, the thermal foil of the present invention can be configured into a variation of shapes and attachments to the heat sink. FIGS. 7 and 8 show one embodiment of the present invention in which a heat dissipating package 30 is shown having a rectangular base 32, and a thin deformable rectangular foil covering 34 mounted to the base 32. The base 32 is provided with slots 36 into which the edges 38 of the foil are placed. FIGS. 9 and 10 show another embodiment having a rectangular base 32 and a thin deformable, curvilinear foil covering 40 mounted to the base 32. The base 32 is provided with a circular slot 42 into which the edges 44 of the foil are placed.

The present invention improves the conductive thermal performance of the interface between the electronic component, such as an integrated circuit on a printed wiring board ("PWB"), and the heat sink, such as a frame or cooling/stiffening plate. The various embodiments described above provide heat sinks which: have less contamination than grease; offer better handling with a cured state of bonding versus the "smearing" of grease; use less bond material by volume than cure-in-place thermal bonds; reduce thermal resistance relative to cure-in-place thermal bonds; have a greater tolerance for larger air gaps and more part-to-part gap variation than cure-in-place thermal bonds; have substantially better thermal conductance than preformed thermal pads and especially thermal interface resistance; require substantially less compression than preformed thermal pads to cause less damage to solder joints; have less than one quarter the thermal resistance of a comparable thickness copper; have less than one half the mass of a comparable thickness of copper; have less than one-eighth the thermal resistance of a comparable thickness of aluminum; require less "personalization" or "customization" for individual application to high power components compared to metallic or composite heat sinks, and provide a commercial off-the-shelf (COTS), reduced cost heat sink through the elimination of skyline profiling and the relaxation of machining tolerances.

The heat sink cost is reduced through elimination of skyline profiling and relaxation of machining tolerance. Application to pure COTS assemblies could take the form of removing individual component heat sinks and adding a cooling/stiffening plate with the high performance composite thermal foil in contact with the components. Because the thermal foil can be deformed to conform to the individual electronic component heights of the PWB, the machining tolerance of the thermal foil drop distance from the heat sink contact surface to the electronic component contact surface can be opened up without degrading thermal performance.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. A heat sink apparatus for use with one to many electronic components mounted on a printed wiring board and including a variety of geometry in three dimensions, comprising:
    a heat sink having a substantially flat surface area; and
    a single piece of foil having a multiplicity of dome constructions formed in the foil;
    said multiplicity of dome constructions being affixed to said surface area of said heat sink around a periphery of each dome construction of said multiplicity of dome constructions and adapted for proximal location facing an electronic component side of a printed wiring board, with said each dome construction being a deformable, convex shell construction shaped to mechanically bias a distal portion of said dome construction away from said heat sink, to provide contact between said distal portion and a top surface of an electronic component mounted opposite said heat sink to conduct heat there from, and to enable deformation of said dome construction as a result of contact with a top surface of an electronic component;

said multiplicity of dome constructions being deformable to tolerate differences in spacing between said heat sink and different electronic components having a variety of geometry in three dimensions and still provide contact with top surfaces of the different electronic components when said multiplicity of dome constructions are mounted opposite the different electronic components; and said multiplicity of dome constructions having non-plastic deformation to allow relative movement between said heat sink and the electronic components while maintaining a heat conduction path there between.

2. The apparatus of claim 1, wherein said dome construction includes two layers of foil sandwiching a layer of pyrolytic graphite there between.

3. The apparatus of claim 2, wherein said dome construction includes one or more limited thermal vias between said two layers of foil.

4. The apparatus of claim 1, wherein a multiplicity of dome constructions includes a foil layer having a generally sinusoidal shape along a centered cross section of said multiplicity of dome constructions.

5. The apparatus of claim 1, further comprising a bonding agent located on a contact surface of said dome construction and adapted to maintain physical and thermal contact between said dome construction and an opposed electronic component.

6. The apparatus of claim 5, wherein said dome construction is adapted to flex in response to relative movement between said heat sink and said opposed electronic component.

7. The apparatus of claim 1, wherein said dome construction creates an enclosed volume when affixed to said heat sink.

8. The apparatus of claim 7, further comprising a resilient filling located within said enclosed volume of said dome construction.

9. The apparatus of claim 1, wherein individual dome constructions of said multiplicity of said dome constructions are substantially identical and are affixed to said heat sink surface area in a patterned array.

10. The apparatus of claim 1, further comprising an electrical insulating layer positioned between said multiplicity of dome constructions and opposed electronic components on a printed wiring board.

11. The apparatus of claim 1, wherein individual dome constructions of said multiplicity of dome constructions are arranged and sized for making contact with electronic components on a specific printed wiring board when said heat sink surface area is located substantially parallel to an electronic component surface of said specific printed wiring board.

12. The apparatus of claim 1, wherein each dome construction is a circular convex shell construction shaped to mechanically bias a distal portion of said dome construction away from said heat sink.

13. A combination comprising:
the heat sink apparatus of claim 1;
a printed wiring board spaced from said heat sink to form a space; and
a plurality of electronic components having top surfaces of varying heights on said printed wiring board within said space.

14. A heat sink apparatus for use with a plurality of electronic components mounted on a printed wiring board and including a variety of geometry in three dimensions, comprising:
a heat sink having a substantially flat surface area;
a printed wiring board spaced from said heat sink to form a space;
a single piece of foil having a multiplicity of dome constructions formed in the foil;
said multiplicity of dome constructions being affixed to said surface area of said heat sink around a periphery of each dome construction of said multiplicity of dome constructions and adapted for proximal location facing the side of the printed wiring board on which the electronic components are located, with said each dome construction being a deformable, convex shell construction shaped to mechanically bias a distal portion of said dome construction away from said heat sink, to provide contact between said distal portion and the top surfaces electronic components mounted opposite said heat sink to conduct heat there from, and to enable deformation of said dome construction as a result of contact with the top surfaces of the electronic components;

said multiplicity of dome constructions being deformable to tolerate differences in spacing between said heat sink and different electronic components having a variety of geometry in three dimensions and still provide contact with top surfaces of the different electronic components when said multiplicity of dome constructions are mounted opposite the different electronic components; and said multiplicity of dome constructions having non-plastic deformation to allow relative movement between said heat sink and the electronic components while maintaining a heat conduction path there between.

* * * * *